United States Patent [19]

Sasaki et al.

[11] Patent Number: 5,372,658
[45] Date of Patent: Dec. 13, 1994

[54] DISORDERED CRYSTALLINE SEMICONDUCTOR

[75] Inventors: Akio Sasaki, Kyoto; Susumu Noda, Takatsuki, both of Japan

[73] Assignee: President of Kyoto University, Kyoto, Japan

[21] Appl. No.: 39,558

[22] Filed: Mar. 22, 1993

Related U.S. Application Data

[63] Continuation of Ser. No. 841,782, Mar. 2, 1992, abandoned, which is a continuation of Ser. No. 416,460, Oct. 3, 1989, abandoned.

[30] Foreign Application Priority Data

Aug. 22, 1989 [JP] Japan ................... 1-215601

[51] Int. Cl.$^5$ .......................................... H01L 21/12
[52] U.S. Cl. ................................ 148/33.4; 437/81; 437/85; 437/95; 437/96; 437/105; 437/107; 437/110; 437/126; 437/133; 437/987; 148/33.5
[58] Field of Search ................ 437/81, 85, 95, 96, 437/105, 107, 110, 126, 133, 987; 148/33.4, 33.5, DIG. 41, DIG. 97, DIG. 160

[56] References Cited

U.S. PATENT DOCUMENTS

| | | | |
|---|---|---|---|
| 4,833,101 | 5/1989 | Fujii | 437/110 |
| 4,927,471 | 5/1990 | Okuda | 437/110 |
| 4,937,204 | 6/1990 | Ishibashi et al. | 437/110 |
| 4,948,752 | 8/1990 | Geissberger et al. | 437/110 |

OTHER PUBLICATIONS

Baba et al., ". . . Al-Ga-As system and its control by superlattice structure," Surface Science, vol. 174, No. 1-3, Aug. 1986, pp. 408-419.

Auoray et al., ". . . GaAlAs-GaAs superlattices . . . ", Revue Phys. Appl., 24, Jul. 1989, pp. 711-720.

Sakaki et al., ". . . GaAs—AlAs Quantum Well Structures . . . ", Jpn. J. Appl. Phys., vol. 24, No. 6, Jun. 1985, pp. L417-L420, Chang et al., "The growth of a GaAs-GaAlAs superlattice", J. Vac. Sci. Technol., vol. 10, No. 1, Jan./Feb. 1973, pp. 11-16.

Fukui et al., "(InAs), (GaAs), Layered Crystal Groun an (100)InP by MOCVD", Jpn. J. Appl. Phys., vol. 24, No. 10, Oct. 1985, pp. L774-L776.

Gossard et al., "Epitoxial Structures with Alternate-Atomic-Layer Composition Modulation", Appl. Phys. Lett., vol. 29, No. 6, 15 Sep. 1976, pp. 323-325.

*Primary Examiner*—R. Bruce Breneman
*Assistant Examiner*—Ramamohan Rao Paladugu
*Attorney, Agent, or Firm*—Oblon, Spivak, McClelland, Maier & Neustadt

[57] ABSTRACT

A semiconductor material having a disordered structure consists of a semiconductor material on which epitaxial growth is possible. The semiconductor material has an energy band structure constituted by one of the indirect band structure, the direct band structure, and a combination of the indirect and the direct band structures, and consists of a plurality of semiconductor layers. The semiconductor layer is orderly arranged along its surface and disorderly arranged along its thickness direction with respect to at least one of the followings the number of atomic or molecular layers constituting the semiconductor layer, a composition of a specific molecular layer of the molecular layers, and impurity doped to the semiconductor layer.

13 Claims, 5 Drawing Sheets

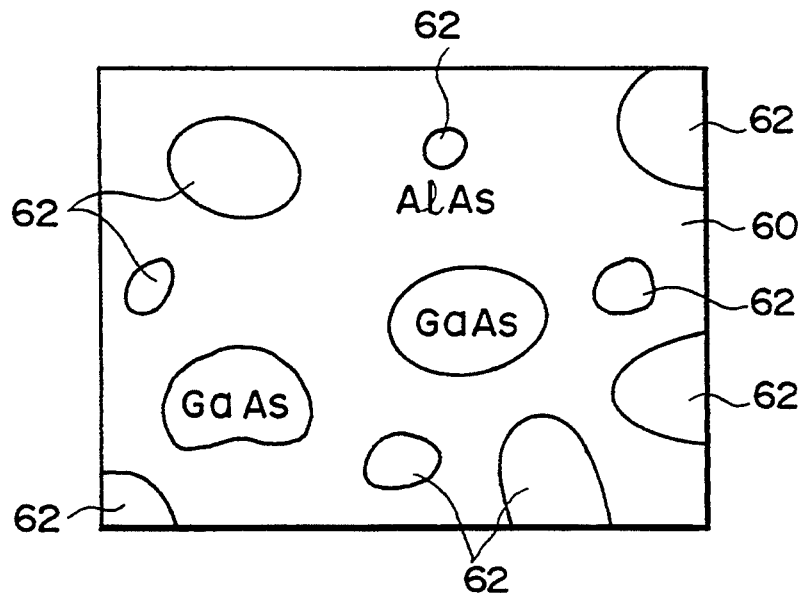
F I G. 9
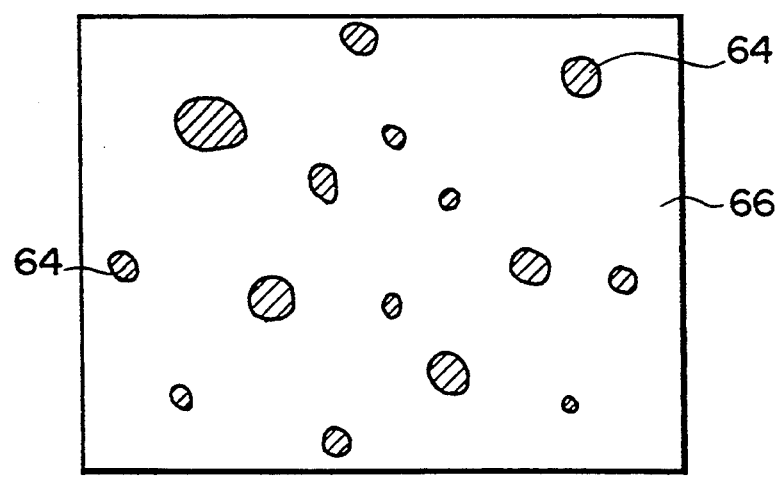
F I G. 10

DISORDERED CRYSTALLINE SEMICONDUCTOR

This application is a continuation of application Ser. No. 07/841,782, filed on Mar. 2, 1992, now abandoned.

BACKGROUND OF THE INVENTION

1. Field of the Invention

The present invention relates to a semiconductor material having an irregular or disordered structure and, more particularly, to an improvement in an optical function and performance of a semiconductor material.

2. Description of the Related Art

As a semiconductor material for a light-emitting device, single crystal gallium arsenide (GaAs) or an amorphous silicon (Si) semiconductor has been conventionally used. Single crystal GaAs has the direct band structure and is suitable as a light-emitting material. Since, however, an energy band width of single crystal GaAs is $\epsilon_g = 1.43$ eV, its light-emission wavelength $\lambda$ is 0.867 μm, i.e., an infrared light. An amorphous Si semiconductor has a high light-emission intensity obtained by recombination through its localized level and has properties suitable as a material for a light-emitting device. Amorphous Si, however, cannot be epitaxially grown. Therefore, it is difficult to fabricate a device which requires epitaxial growth on the amorphous silicon.

Although a single crystal silicon (Si) semiconductor material can be epitaxially grown, it has the indirect band structure. Therefore, single crystal Si is not suitable as a material for a light-emitting device.

AlP and GaP have energy band widths of $\epsilon_g = 2.43$ eV ($\lambda = 0.510$ μm) and $\epsilon_g = 2.25$ eV ($\lambda = 0.551$ μm), respectively, and emission light colors of green and yellowish green, respectively. Therefore, both the materials can emit visible light. Since, however, both the materials have the indirect band structure, their light-emission efficiencies are very low.

As described above, the conventional semiconductor materials for a light-emitting device have specific problems, respectively.

SUMMARY OF THE INVENTION

The present invention has been made in order to solve the above-noted problems and has as its object to provide a disordered crystalline semiconductor material as a semiconductor material on which an epitaxial growth is possible and which has characteristics suitable as a light-emitting material.

In order to achieve the above object, a first embodiment of the disordered crystalline semiconductor material of the present invention is provided which is a semiconductor material on which an epitaxial growth is possible. The semiconductor material has an energy band structure constituted by an indirect band structure, a direct band structure, or a combination of the indirect and the direct band structures. The semiconductor material consists of a plurality of semiconductor layers, each of the semiconductor layers being ordered in atomic alignment along the surface of the semiconductor layer and being disordered in atomic alignment along the thickness direction of the semiconductor layer with respect to at least one of the followings: the number of atomic or molecular layers constituting each semiconductor layer, a composition of a specific molecular layer of the molecular layers, and impurity doped to the semiconductor layer.

In order to achieve the above object, a second embodiment of the disordered crystalline semiconductor material of the present invention is provided which is a semiconductor material on which an epitaxial growth is possible. The semiconductor material has an energy band structure constituted by the indirect band structure, the direct band structure, or a combination of the indirect and the direct band structures, the semiconductor material consisting of a plurality of semiconductor layers, each of the semiconductor layers being ordered in atomic alignment along the thickness direction of the semiconductor layer and being disordered in atomic alignment along the surface of the semiconductor layer with respect to at least one of a composition distribution of the semiconductor layer and impurity doped to the semiconductor layer.

In order to achieve the above object, a third embodiment of the disordered crystalline semiconductor material of the present invention is provided which is a semiconductor material on which an epitaxial growth is possible. The semiconductor material has an energy band structure constituted by the indirect band structure, the direct band structure, or a combination of the indirect and the direct band structures. The semiconductor material comprises a plurality of semiconductor layers, each of the semiconductor layers being disordered in atomic alignment along the thickness direction of the semiconductor layer with respect to at least one of the number of atomic or molecular layers constituting the semiconductor layer, a composition of a specific molecular layer of the molecular layers, and impurity doped to the semiconductor layer and being disordered in atomic alignment along the surface of the semiconductor layer with respect to at least one of a composition distribution of the semiconductor layer and impurity doped to the semiconductor layer.

The semiconductor layer may be constituted by a silicon layer, and an impurity may be disorderly added to the silicon layer by delta doping.

The semiconductor layer may be constituted by silicon and germanium.

The semiconductor material may be constituted by a superlattice semiconductor material.

As described above, the semiconductor layer may be constituted by a material having the indirect band structure, a material having the direct band structure, or a combination of materials having the direct and the indirect band structures.

The indirect transition type of semiconductor material has light-emission intensity lower than that of the direct transition type of semiconductor material. According to the semiconductor material of the present invention, however, a large number of localized levels can be formed, and a momentum deviation at the localized level can be considered to increase to infinity on the basis of the uncertainty principle $\Delta r \cdot \Delta k \geq h/4\pi$ of Heisenberg. Therefore, an amorphous-like semiconductor material can be obtained, and a radiative transition probability can be increased, thereby increasing the light-emission intensity.

In addition, high light-emission intensity can be expected for a material having a large band gap such as AlP or GaP which is not suitable as a light-emitting device because it has the indirect band structure. As a result, a semiconductor for light-emitting devices capable of emitting light of a wavelength range shorter than that currently obtained can be obtained.

Since a semiconductor for light-emitting devices can be obtained by using the indirect transition type of semiconductor, e.g., silicon, optoelectronic integrated circuits based on a silicon material can be realized. Therefore, current semiconductor technologies can be significantly improved.

When the present invention is applied to a semiconductor material having the direct band structure, light-emission intensity can be greatly increased. When the semiconductor material of the present invention is fabricated by using materials having the direct and the indirect band structures, a material which did not easily emit light conventionally can easily emit light, and a material which easily emitted light conventionally can emit light even more easily.

Furthermore, since the semiconductor material can be formed by epitaxial growth as a conventional technique, it can be easily grown.

BRIEF DESCRIPTION OF THE DRAWINGS

Other objects and advantages will be apparent from the following description taken in conjunction with the accompanying drawings in which:

FIGS. 9 and 10 are plan views of disordered crystalline semiconductor materials according to other embodiments of the present invention.

DETAILED DESCRIPTION OF THE PREFERRED EMBODIMENTS

Figure 2:
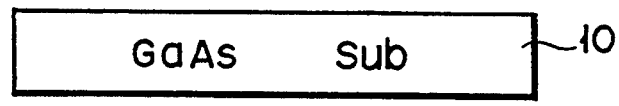
FIG. 2 is a view showing a method of fabricating the disordered crystalline semiconductor material shown in FIG. 1.
Figure 2:
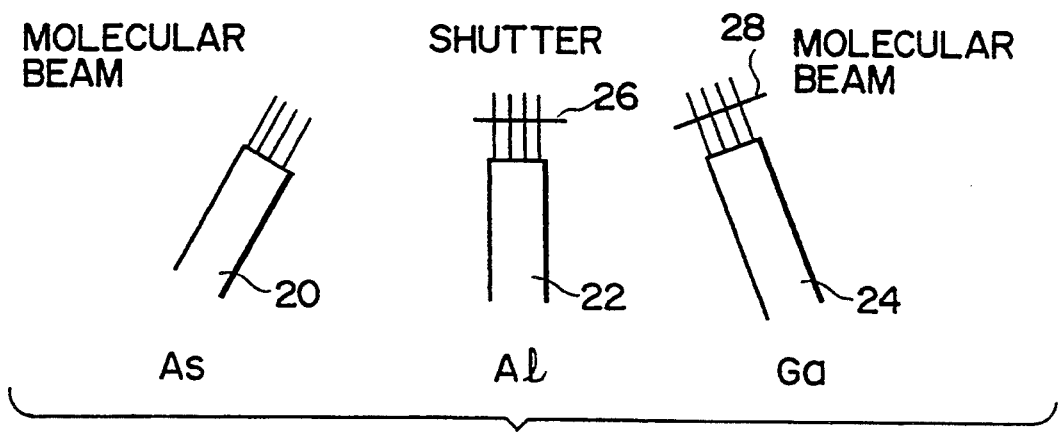
Figure 3:
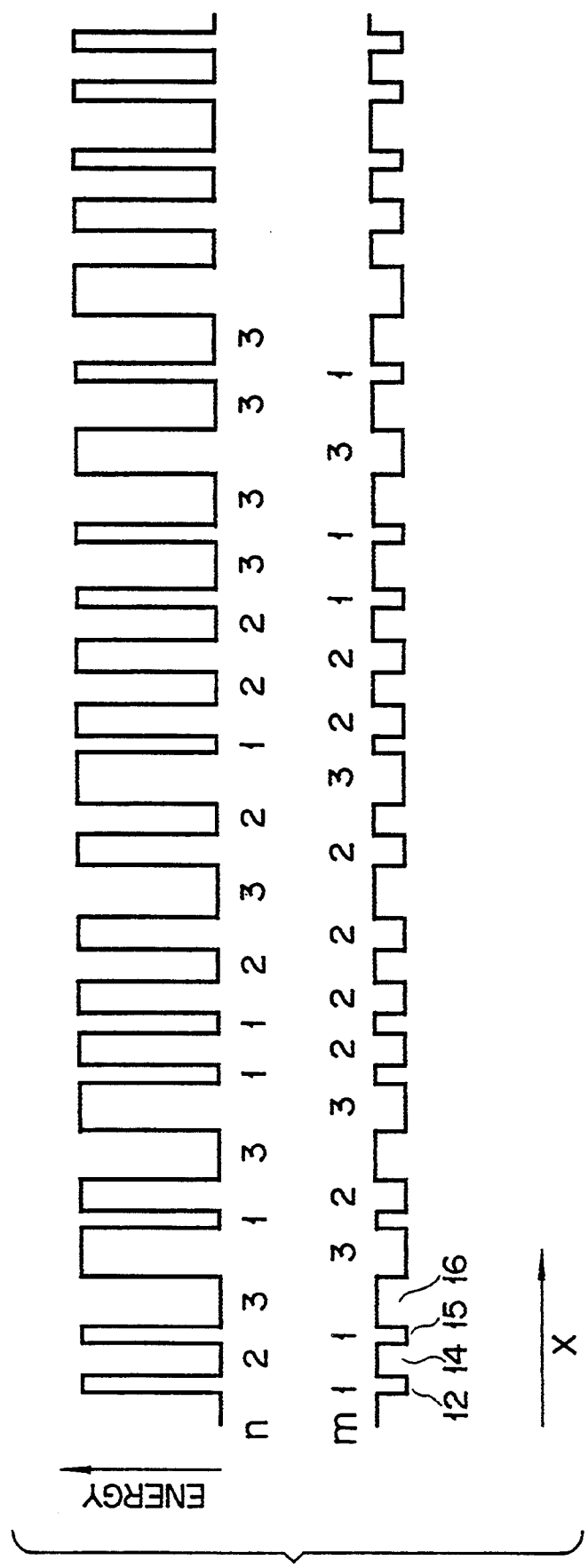
FIG. 3 is a view showing an energy band structure of the disordered crystalline semiconductor material according to the first embodiment.

The first embodiment of a disordered crystalline semiconductor material according to the present invention will be described below with reference to FIGS. 1 to 3.

Figure 1:
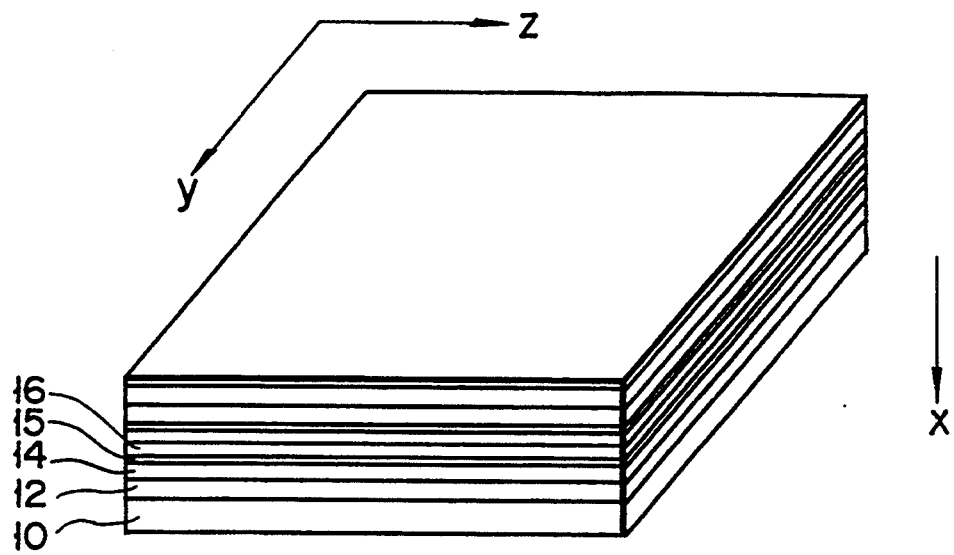
FIG. 1 is a perspective view of a disordered crystalline semiconductor material according to the first embodiment of the present invention.

FIG. 1 shows a superlattice semiconductor material having an ordered atomic alignment in the y-z plane and a disordered atomic alignment along the x direction, i.e., a thickness direction. This material is obtained by sequentially and alternately depositing semiconductor materials having different energy band gaps ($\epsilon_g$) in a disordered number of molecular layers on a GaAs substrate 10. For example, $(AlAs)_m(GaAs)_n$ is constituted by using AlAs having $\epsilon_g$ of 2.17 eV and GaAs having $\epsilon_g$ of 1.43. As shown in FIG. 3, the first layer is constituted by an AlAs layer 12 of one molecular layer, the second layer is constituted by a GaAs layer 14 of two molecular layers, the third layer is constituted by an AlAs layer 15 of one molecular layer, and the fourth layer is constituted by a GaAs layer 16 of three molecular layers. In this manner, the AlAs and the GaAs layers are alternately deposited while irregularity is given to the numbers of molecular layers. The number of molecular layers in each of the AlAs and the GaAs layers is determined by a random number sequence generated from a random number table. Appearance probabilities P(1), P(2), and P(3) of layer numbers of one, two, and three are $\frac{1}{3}$, respectively. Alternatively, the probabilities can be set such that P(1)=P(2)=P(3)=$\frac{1}{3}$ or P(1)=P(3)=$\frac{1}{4}$ and P(2)=$\frac{1}{2}$.

Although the values m and n are constant in a normal superlattice, they are not constant in this embodiment.

A method of manufacturing the above disordered crystalline semiconductor material will be described below with reference to FIG. 2. Basically, a molecular beam epitaxial method is used. The GaAs substrate 10 is arranged in a vacuum atmosphere at $10^{-10}$ to $10^{-11}$ Torr. An As gun 20, an Al gun 22, and a Ga gun 24 are arranged in front of the substrate 10. Molecular beams of As, Al, and Ga are emitted from the respective guns onto the substrate 10. Shutters 26 and 28 are arranged in front of the Al and Ga guns 22 and 24. By always emitting As from the As gun 20 while irregularly controlling the open/close times of the shutters 26 and 28 by using a random number table, AlAs and GaAs layers are alternately deposited while the number of molecular layers in the AlAs and GaAs layers are irregularly changed. However, the chemical composition of the above disordered crystalline semiconductor is kept as 50% of GaAs and 50% of AlAs with respect to the bulk alloy and the normal superlattices mentioned below. Note that in a normal superlattice manufacturing method, the open/close times of the shutters 26 and 28 are not irregular but are regular.

A temperature characteristic of photoluminescence (PL) of the $(AlAs)_m(GaAs)_n$ disordered crystalline semiconductor formed as described above was compared with those of bulk alloy $Al_{0.5}Ga_{0.5}As$, a normal two-molecule-layer superlattice $(AlAs)_2/(GaAs)_2$, and a normal three-molecule-layer superlattice $(AlAs)_3/(GaAs)_3$.

The PL intensities of the $(AlAs)_m(GaAs)_n$ disordered crystalline semiconductor are $6 \times 10^4$, $6 \times 10^3$, and $1.5 \times 10^1$ at 4 K, 77 K, and room temperature, respectively. The PL intensities of $Al_{0.5}Ga_{0.5}As$ bulk alloy are $4 \times 10^3$, $2 \times 10^0$, and $3 \times 10^{-1}$, respectively. The PL intensities of $(AlAs)_2/(GaAs)_2$ normal superlattice are $5 \times 10^2$, $1.5 \times 10^0$, and $5 \times 10^{-1}$, respectively. The PL intensities of $(AlAs)_3/(GaAs)_3$ normal superlattice are $7 \times 10^4$, $5 \times 10^{-1}$, and $15 \times 10^{-1}$, respectively. The overall PL intensities of the $(AlAs)_m(GaAs)_n$ disordered crystalline semiconductor are 6/7 to $1.5 \times 10$ times, $3 \times 10^3$ to $1.2 \times 10^4$ times, and 30 to 100 times those of the bulk alloy and the normal superlattices at 4 K, 77 K, and room temperature, respectively. That is, the light-emission characteristic of this disordered crystalline semiconductor is significantly superior to those of the bulk alloy and the normal superlattices.

The second embodiment in which irregularity is given to a superlattice arranged by the indirect transition type of semiconductors will be described below this embodiment, irregularity is given to the number of molecular layers constituting an AlAs layer and an $Al_{0.5}Ga_{0.5}As$ layer. That is, in $(AlAs)_m(Al_{0.5}Ga_{0.5}As)_n$, values m and n are irregularly changed. As in the first embodiment, a molecular beam epitaxial method is used to manufacture $(AlAs)_m(Al_{0.5}Ga_{0.5}As)_n$. The number of molecular layers in each layer of AlAs and $Al_{0.5}Ga_{0.5}As$ is determined by a random number table. As an example, appearance probabilities of layer numbers of one, two, and three are $\frac{1}{3}$, respectively. The layer numbers of $Al_{0.5}Ga_{0.5}As$ and AlAs are determined by controlling an open/close time of a shutter of a Ga molecular beam gun.

A PL (photoluminescence) characteristic of this disordered superlattice $(AlAs)_m(Al_{0.5}Ga_{0.5}As)_n$ was compared with those of an $Al_{0.76}Ga_{0.24}As$ bulk alloy semiconductor and an $(AlAs)_2/(Al_{0.5}Ga_{0.5}As)_2$ two-molecule-layer superlattice. The disordered superlattice $(AlAs)_m(Al_{0.5}Ga_{0.5}As)_n$, the $Al_{0.76}Ga_{0.24}As$ bulk alloy semiconductor, and the $(AlAs)_2/(Al_{0.5}Ga_{0.5}As)_2$ two-molecule-layer superlattice exhibited light-emission peaks at 605.0 nm (2.049 eV), 597.0 nm (2.077 eV), and 597.5 nm (2.075 eV), respectively. The light-emission intensity of the irregular superlattice $(AlAs)_m(Al_{0.5}Ga_{0.5}As)_n$ is 14 times and 2.3 times those of the $Al_{0.76}Ga_{0.24}As$ bulk alloy semiconductor and the $(AlAs)_2/(Al_{0.5}Ga_{0.5}As)_2$ two-molecule-layer superlattice, respectively. That is, the indirect transition type of disordered superlattice exhibited higher light-emission intensity than those of the bulk alloy semiconductor and the normal superlattice.

Figure 4:
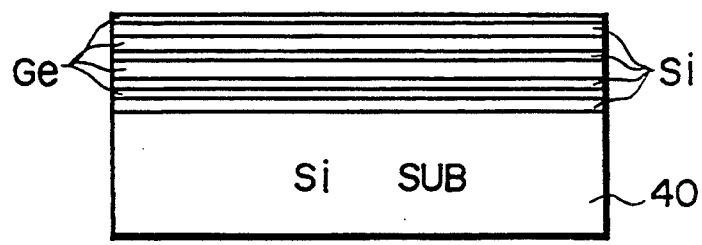
FIG. 4 is a sectional view of a disordered crystalline semiconductor material according to the third embodiment of the present invention; of a disordered crystalline semiconductor material according to the fourth embodiment of the present invention.

The third embodiment of a disordered superlattice using Si ($\epsilon_g=1.12$ eV) and Ge ($\epsilon_g=0.80$ eV) will be described below with reference to FIG. 4. By irregularly changing the number of atoms comprising an Si atomic layer and a Ge atomic layer as in the above embodiments, $Si_mGe_n$ is formed by epitaxial growth on an Si substrate 40. The values m and n are not constant but irregularly changed. With such an arrangement, the light-emission intensity of an indirect transition type of semiconductor can be increased, and an optical semiconductor device can be formed by using silicon which is a material known best in the manufacturing technique. Therefore, devices by this indirect transition type of semiconductor can be easily manufactured.

Figure 5:
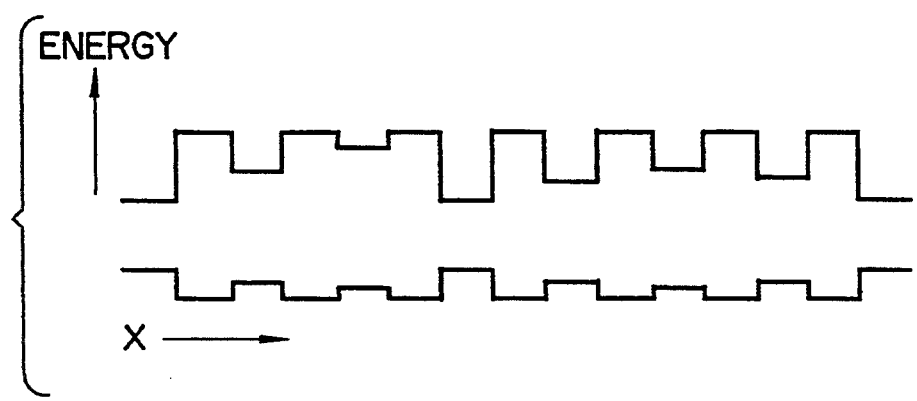
FIG. 5 is a view showing an energy band structure of a disordered crystalline semiconductor material according to the fourth embodiment of the present invention.

The fourth embodiment of disordered crystalline semiconductor material according to the present invention will be described below with reference to FIGS. 5 and 6. In this embodiment, although the number of molecular layers in a semiconductor layer constituting a superlattice is predetermined as shown in FIG. 5, a composition of the semiconductor layer is irregularly changed. For example, in $(AlAs)_a(Al_{1-x}Ga_xAs)_b$, the values a and b are predetermined to have periodicity as in a normal superlattice, while the value x is irregularly changed in each $Al_{1-x}Ga_xAs$ layer.

Figure 6:
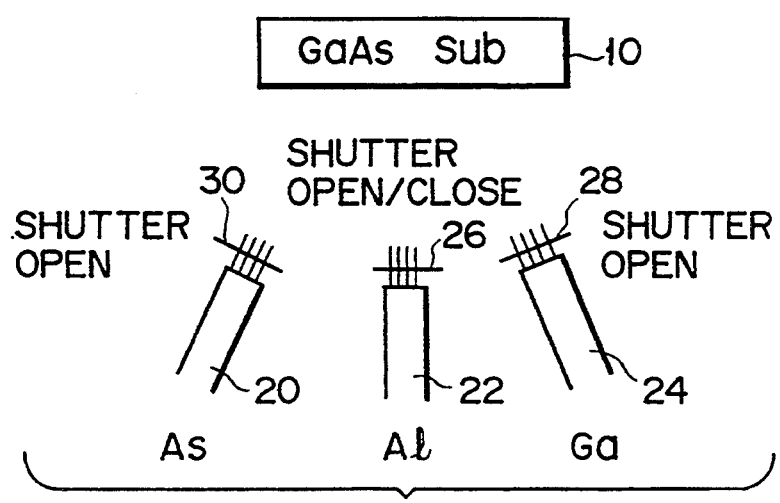
FIG. 6 is a view showing a method of growing the disordered crystalline semiconductor material according to the fourth embodiment.

Such a disordered superlattice $(AlAs)_a(Al_{1-x}Ga_xAs)_b$ is formed by an organometallic metal molecular beam epitaxial growth method using an apparatus as shown in FIG. 6. Referring to FIG. 6, shutters 30 and 28 arranged in front of As and Ga guns 20 and 24, respectively, are normally open, while a shutter 26 before an Al gun 22 is periodically opened/closed. Although the amount of an Al molecular beam is constant while the shutter 26 of the Al gun 22 is open, it is irregularly changed from one open state to another. In addition, the Al amount need not be constant in one open state. In this manner, since a composition of each $Al_{1-x}Ga_xAs$ layer can be irregularly changed, a superlattice having irregularity can be obtained.

In this embodiment, the same effects as in the above embodiments can be obtained.

Note that like $(Al_{1-x}Ga_xAs)_a(Al_{1-y}Ga_yAs)_b$, the values x and y of both the layers may be irregularly changed.

In addition, the composition of each layer may be irregularly changed as in the fourth embodiment while the number of molecular layers is irregularly changed as in the first to third embodiments.

Figure 7:
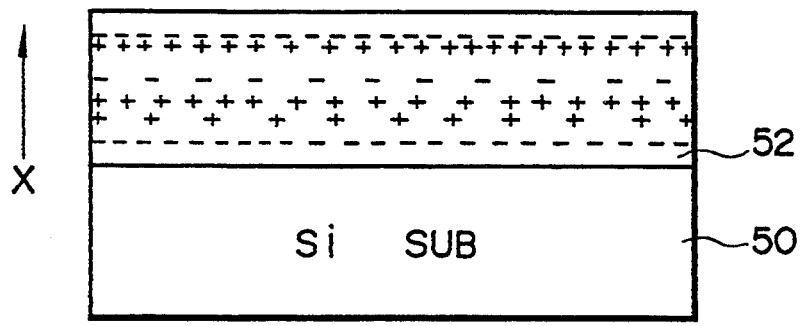
FIG. 7 is a sectional view showing a disordered crystalline semiconductor material according to the fifth embodiment of the present invention.
Figure 8:
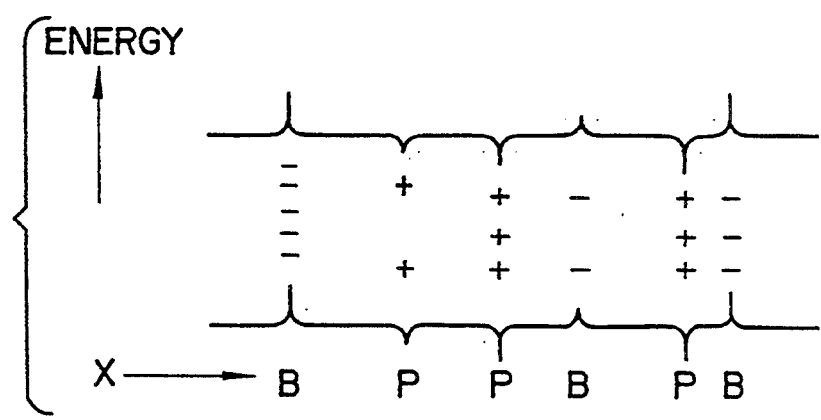
FIG. 8 is a view showing an energy band structure of the disordered crystalline semiconductor material according to the fifth embodiment of the present invention.

The fifth embodiment of the present invention will be described below with reference to FIGS. 7 and 8. As shown in FIGS. 7 and 8, a Si atomic layer 52 is grown a Si substrate 50 by an epitaxial method and at the same time boron B and phosphorus P are irregularly delta-doped. That is, an impurity concentration at a specific position and/or an arrangement of n- and p-type impurities along the x axis is irregularly changed. FIG. 8 shows a state of delta doping along the x axis of the Si atomic layer 52, and an energy band structure obtained by delta doping. According to this embodiment, a high-output optical semiconductor device can be easily manufactured by silicon epitaxial growth and delta doping. A merit of realizing an optical IC by using only a silicon material as described above is great.

When the impurity doping technique of the fifth embodiment is applied to at least one of the first to fourth embodiments, the irregularity of the semiconductor material can be further increased.

In each of the above embodiments, the irregularity is realized in the x direction, i.e., the thickness direction, while the semiconductor material along the surfaces of individual layers is uniform, i.e., regular in the y-z plane perpendicular to the x direction. A technical concept of the present invention, however, can be developed as follows. That is, while a thickness of each atomic or molecular layer, a composition of each molecular layer, and impurity arrangement and concentration in the x direction are kept regular, at least one of a region area of an atomic or molecular individual layer, a composition of a molecular layer, an impurity concentration distribution, and an impurity arrangement in the y-z plane can be irregularly changed.

For example, AlAs and GaAs layers 60 and 62 can be irregularly arranged as shown in FIG. 9. Since Al, Ga and In are Group III elements and P, As, and Sb are Group V elements, nine types of Group III-V semiconductors can be formed. In particular, since AlAs and GaAs have substantially almost same interatomic distance, AlAs and GaAs can be irregularly arranged in the y-z plane.

In addition, as shown in FIG. 10, a focused ion beam may be radiated on the y-z plane of a GaAs layer 66 to irregularly form an impurity layer 64.

Furthermore, the present invention can be developed such that the above irregularity is realized in both the x direction and y-z plane.

As described above, the present invention can be variously modified and carried out within the scope of the invention.

What is claimed is:

1. A semiconductor material on which epitaxial growth is possible, said semiconductor material having an energy band structure constituted by one of an indirect band structure, a direct band structure, and a combination of the indirect and the direct band structures, said semiconductor material comprising a superlattice consisting of plural kinds of semiconductor layers, and each kind of said semiconductor layers being orderly arranged along the surface of said semiconductor layers and at least one kind of said semiconductor layers being repeated in a disorderly varied form along the thickness direction of said superlattice, wherein at least one of 1) a number of atomic or molecular layers constituting the at least one repeated semiconductor layer, 2) a composition of a specific molecular layer of said at least one repeated semiconductor layer, 3) a concentration of an impurity δ-doped in said at least one repeated semiconductor layer, and 4) a location of an impurity δ-doped in said at least one repeated layer is disorderly varied in the thickness direction of said superlattice.

2. A material according to claim 1, wherein said semiconductor layer consists of a silicon layer, an impurity being disorderly doped to said silicon layer by delta doping.

3. A material according to claim 1, wherein said semiconductor layer consists of silicon and germanium.

4. A material according to claim 1, wherein said semiconductor layers consist of GaAs and AlAs layers, the number of molecular layers constituting each of said GaAs and AlAs layers being disorderly changed.

5. A material according to claim 1, wherein said semiconductor layers consist of AlAs and $Al_xGa_{1-x}As$ ($0<x<1$) layers, the number of molecular layers constituting each of said AlAs and $Al_xGa_{1-x}As$ ($0<x<1$) layers being disorderly arranged.

6. A material according to claim 1, wherein said semiconductor layers consist of AlAs and $Al_{1-x}Ga_xAs$ layers, the number of molecular layers constituting each of said AlAs and $Al_{1-x}Ga_xAs$ layers being predetermined, and a composition of each $Al_{1-x}Ga_xAs$ layer being disorderly arranged.

7. A material according to claim 1, wherein said semiconductor layers consist of $Al_{1-x}Ga_xAs$ and $Al_{1-y}Ga_yAs$ layers, the number of molecular layers constituting each of said $Al_{1-x}Ga_xAs$ and $Al_{1-y}Ga_yAs$ layers being predetermined, and a composition of each of said $Al_{1-x}Ga_xAs$ and $Al_{1-y}Ga_yAs$ layers being disorderly changed.

8. A semiconductor material on which epitaxial growth is possible, said semiconductor material having an energy band structure constituted by one of an indirect band structure, a direct band structure, and a combination of indirect and direct band structures, said semiconductor material comprising a superlattice consisting of plural kinds of semiconductor layers, and each kind of said semiconductor layers being orderly arranged along the thickness direction of said superlattice and wherein at least one of 1) a composition of at least one kind of the semiconductor layers within a respective semiconductor layer, 2) a concentration of an impurity δ-doped in the surface of a respective semiconductor layer, and 3) a location of an impurity δ-doped in the surface of a respective semiconductor layer is disorderly varied.

9. A material according to claim 8, wherein said semiconductor layers consist of a silicon layer, an impurity being disorderly doped to said silicon layer by delta doping.

10. A material according to claim 8, wherein said semiconductor layers consist of silicon and germanium.

11. A semiconductor material on which epitaxial growth is possible, said semiconductor material having an energy band structure constituted by one of an indirect band structure, a direct band structure, and a combination of the indirect and the direct band structures, said semiconductor material comprising a superlattice consisting of plural kinds of semiconductor layers, in which at least one kind of said semiconductor layers is repeated in disorderly varied form in the thickness direction of the superlattice with at least one of 1) a number of atomic or molecular layers constituting said at least one repeated semiconductor layer, 2) a composition of a specific molecular layer of said at least one repeated semiconductor layer, 3) a concentration of an impurity δ-doped in said at least one repeated semiconductor layer, and 4) a location of an impurity δ-doped to said at least one repeated layer being disorderly varied in the thickness direction of said superlattice and in which at least one kind of the semiconductor layers is disorderly varied along its surface to have at least one of 1) a disorderly varied composition distribution, 2) a disorderly varied concentration of an impurity δ-doped in the respective at least one kind of said semiconductor layers, and 3) a disorderly varied location of an impurity δ-doped in the respective at least one kind of said semiconductor layers along its surface.

12. A material according to claim 11, wherein said semiconductor layers consist of a silicon layer, an impurity being disorderly doped to said silicon layer by delta doping.

13. A material according to claim 11, wherein said semiconductor layers consist of silicon and germanium.

* * * * *